(12) United States Patent
Lin et al.

(10) Patent No.: US 8,432,703 B2
(45) Date of Patent: Apr. 30, 2013

(54) FIXING APPARATUS FOR CIRCUIT BOARD

(75) Inventors: Chieh-Hsiang Lin, Taipei Hsien (TW);
Wen-Tang Peng, Taipei Hsien (TW)

(73) Assignee: Hon Hai Precision Industry Co., Ltd.,
New Taipei (TW)

( * ) Notice: Subject to any disclaimer, the term of this patent is extended or adjusted under 35 U.S.C. 154(b) by 305 days.

(21) Appl. No.: 12/960,369

(22) Filed: Dec. 3, 2010

(65) Prior Publication Data

US 2012/0127679 A1    May 24, 2012

(30) Foreign Application Priority Data

Nov. 18, 2010  (TW) ............................... 99139631 A

(51) Int. Cl.
*H05K 5/00* (2006.01)
*H05K 1/14* (2006.01)
*H05K 7/02* (2006.01)

(52) U.S. Cl.
USPC ........... 361/759; 361/803; 361/804; 361/807; 361/809; 361/810

(58) Field of Classification Search .................. 361/759, 361/803, 804, 807, 809, 810
See application file for complete search history.

(56) References Cited

U.S. PATENT DOCUMENTS

| 4,929,185 | A | * | 5/1990 | Wong et al. | 439/74 |
|---|---|---|---|---|---|
| 5,499,163 | A | * | 3/1996 | Sonntag et al. | 361/759 |
| 5,519,169 | A | * | 5/1996 | Garrett et al. | 174/371 |
| 6,262,887 | B1 | * | 7/2001 | Lee | 361/679.27 |
| 6,347,044 | B1 | * | 2/2002 | Won et al. | 361/807 |
| 7,593,239 | B2 | * | 9/2009 | Li et al. | 361/807 |
| 2006/0104040 | A1 | * | 5/2006 | Hsu | 361/752 |
| 2011/0134616 | A1 | * | 6/2011 | Liu | 361/759 |

* cited by examiner

*Primary Examiner* — Timothy Thompson
*Assistant Examiner* — Sherman Ng
(74) *Attorney, Agent, or Firm* — Altis Law Group, Inc.

(57) ABSTRACT

A fixing apparatus for a circuit board includes a bottom plate, a number of supporting posts, a number of sleeves, and a number of fasteners. The supporting posts are formed on the bottom plate. The sleeves are detachably installed on the supporting posts, respectively. The fasteners extend through the circuit board and the corresponding sleeves, to engage in the supporting posts, respectively.

3 Claims, 4 Drawing Sheets

FIXING APPARATUS FOR CIRCUIT BOARD

BACKGROUND

1. Technical Field

The present disclosure relates to a fixing apparatus for a circuit board.

2. Description of Related Art

Generally, a circuit board is fixed to a computer chassis through a plurality of detachable supporting posts. When there is a need to fix another circuit board having a different thickness, the plurality of supporting posts should be replaced with other supporting posts. However, manufacturing so many different types of supporting posts is a waste of money.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawing, all the views are schematic, and like reference numerals designate corresponding parts throughout the several views.

DETAILED DESCRIPTION

The disclosure, including the accompanying drawings, is illustrated by way of example and not by way of limitation. It should be noted that references to "an" or "one" embodiment in this disclosure are not necessarily to the same embodiment, and such references mean at least one.

Figure 1:
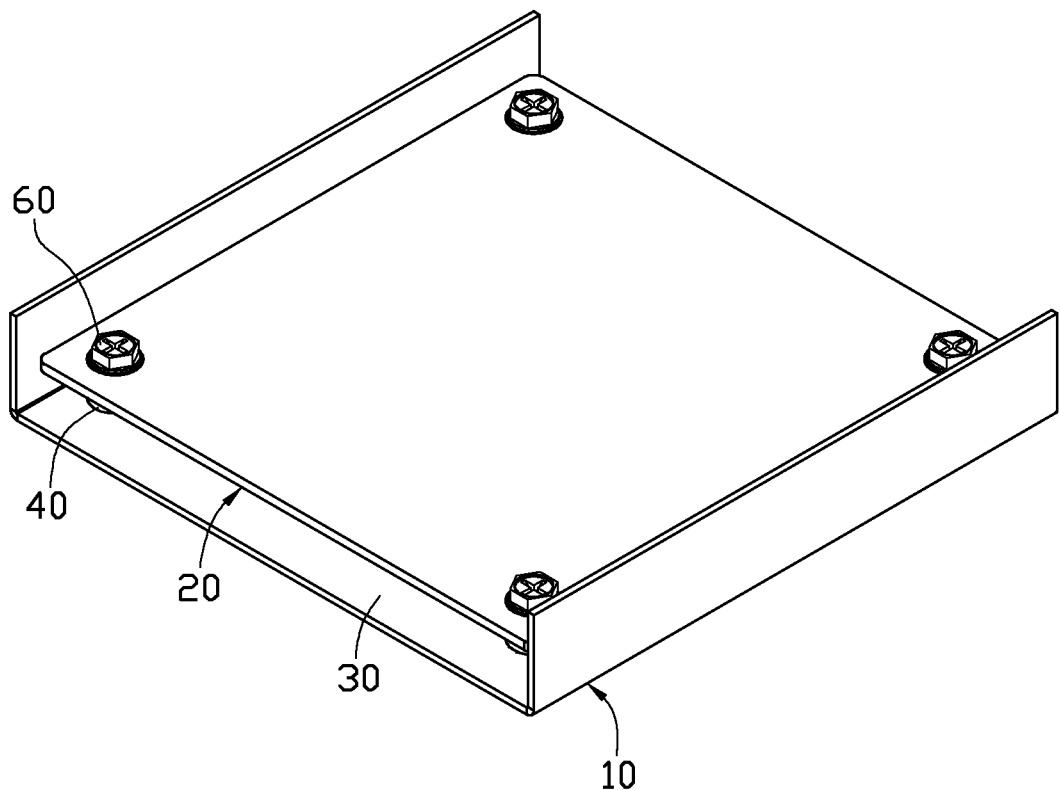
FIG. 1 is an assembled, isometric view of a fixing apparatus together with a circuit board.
Figure 2:
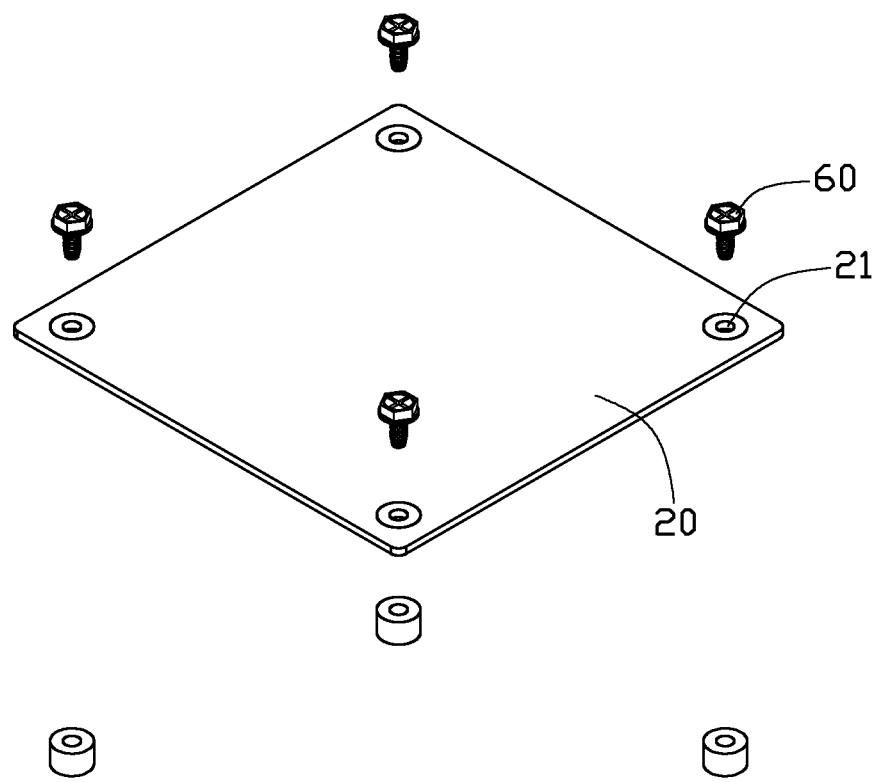
FIG. 2 is an exploded, isometric view of FIG. 1.
Figure 2:
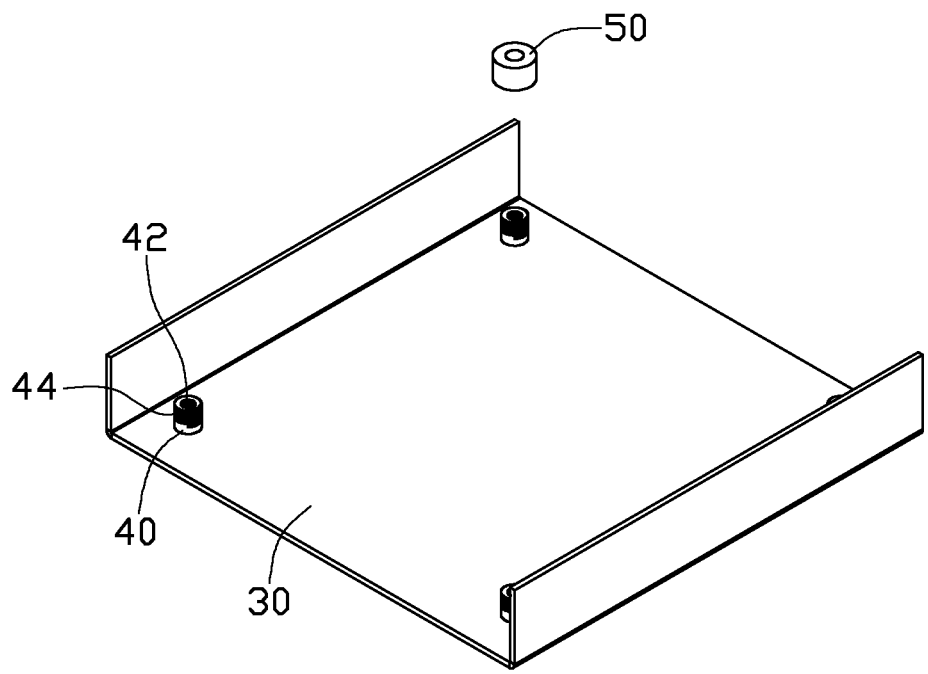

Referring to FIGS. 1 and 2, an embodiment of a fixing apparatus 10 is provided to fix a circuit board 20 defining a plurality of through holes 21. The fixing apparatus 10 includes a bottom plate 30, a plurality of supporting posts 40, a plurality of sleeves 50, and a plurality of fasteners 60. In this embodiment, the fasteners 60 are bolts.

The bottom plate 30 may be a separate element fixed in a computer chassis, or a part of the computer chassis. The supporting posts 40 are formed on the bottom plate 30 corresponding to the through holes 21 of the circuit board 20. A threaded hole 42 is defined in a top of each supporting post 40, and a threaded portion 44 is formed on an upper circumference of each supporting post 40.

Figure 3:
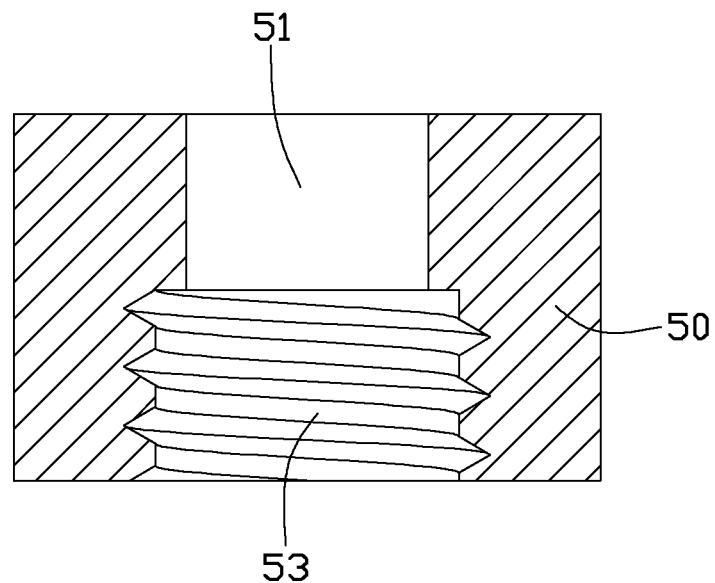
FIG. 3 is a cross-section view of a sleeve of FIG. 2.

Referring to FIG. 3, an unthreaded hole 51 and a threaded hole 53 are axially defined in each sleeve 50 from top to bottom. The unthreaded hole 51 is in communication with the threaded hole 53, and the diameter of the unthreaded hole 51 is less than the major diameter of the threaded hole 53.

Figure 4:
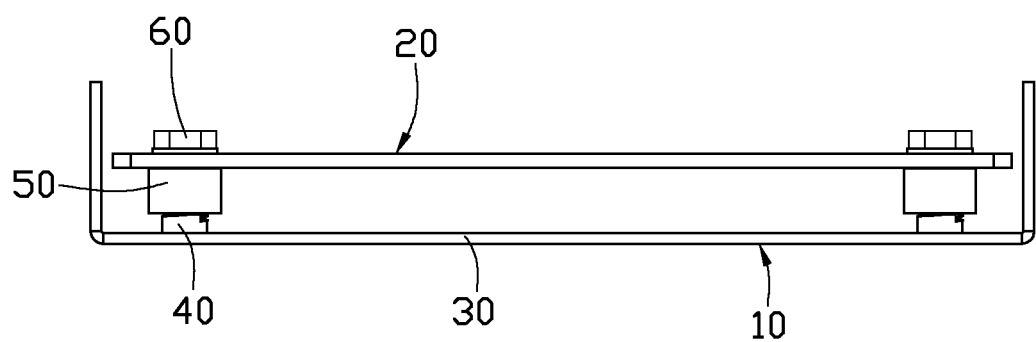
FIG. 4 is a front elevational view of FIG. 1.

Referring to FIG. 4, in assembly, the sleeves 50 are respectively installed on the supporting posts 40, with the threaded portions 44 of the supporting posts 40 respectively engaged in the threaded holes 53 of the sleeves 50. The circuit board 20 is placed on the sleeves 50, to allow the through holes 21 to respectively align with the unthreaded holes 51 of the sleeves 50. The fasteners 60 respectively extend through the through holes 21 of the circuit board 50 and the unthreaded holes 51 of the sleeves 50, to engage in the corresponding threaded holes 42 of the supporting posts 40. Thereby, the circuit board 20 is fixed to the bottom plate 30.

Different height sleeves are designed to ensure top sides of different thickness circuit boards reach a desired height in assembly. The sleeves are small, inexpensive, and convenient to replace.

It is to be understood, however, that even though numerous characteristics and advantages of the embodiments have been set forth in the foregoing description, together with details of the structure and function of the embodiments, the disclosure is illustrative only, and changes may be made in details, especially in matters of shape, size, and arrangement of parts within the principles of the embodiments to the full extent indicated by the broad general meaning of the terms in which the appended claims are expressed.

What is claimed is:

1. A fixing apparatus for a circuit board, comprising:
   a bottom plate;
   a plurality of supporting posts immovably formed on the bottom plate, wherein a threaded portion is formed on an upper circumference of each of the supporting posts;
   a plurality of sleeves detachably installed on the supporting posts, respectively, wherein a threaded hole is axially defined in a lower section of each of the sleeves, the threaded portions of the supporting posts respectively engage in the threaded holes of the sleeves; and
   a plurality of fasteners extending through the circuit board and the corresponding sleeves, to engage with the supporting posts, respectively.

2. The fixing apparatus of claim 1, wherein the fasteners are bolts, a threaded hole is defined in a top of each of the supporting posts, to engage with a corresponding bolt.

3. The fixing apparatus of claim 2, wherein an unthreaded hole is axially defined in an upper section of each of the sleeves in communication with the threaded hole of the corresponding sleeve, to allow a corresponding bolt to extend through the corresponding sleeve.

* * * * *